United States Patent [19]

Maeda et al.

[11] Patent Number: 4,523,089
[45] Date of Patent: Jun. 11, 1985

[54] DRIVING APPARATUS FOR SEMICONDUCTOR LASER

[75] Inventors: Takeshi Maeda, Kokubunji; Yasumitsu Mizoguchi, Odawara; Masahiro Takasago, Odawara; Tokuya Kaneda, Odawara; Yoshito Tsunoda, Mitaka, all of Japan

[73] Assignee: Hitachi, Ltd., Tokyo, Japan

[21] Appl. No.: 411,809

[22] Filed: Aug. 26, 1982

[30] Foreign Application Priority Data

Sep. 4, 1981 [JP] Japan ................................ 56-138582

[51] Int. Cl.³ .......................... G01J 1/32; H01S 3/10
[52] U.S. Cl. ...................................... 250/205; 372/38
[58] Field of Search .................. 372/38, 25, 29, 30; 250/205; 369/106, 108, 116

[56] References Cited

U.S. PATENT DOCUMENTS 4,355,395 10/1982 Salter .................................... 372/38

FOREIGN PATENT DOCUMENTS 3038607 4/1981 Fed. Rep. of Germany .

OTHER PUBLICATIONS

Chen, "Simultaneous Feedback Control of Bias and Modulation Currents for Injection Lasers", *Electronics Letters*, 3rd Jan. 1980, vol. 16, No. 1, pp. 7-8.

*Primary Examiner*—James W. Davie
*Attorney, Agent, or Firm*—Antonelli, Terry & Wands

[57] ABSTRACT

A driving circuit for driving a semiconductor laser by a driving signal containing a pulse signal representing given information and superposed on a DC bias signal includes means for monitoring intensity of laser light emitted when the DC bias is applied, and means for monitoring the intensity of laser light emitted when the pulse signal is applied. The DC bias signal and the pulse signal are varied in dependence on the result of comparisons between the outputs of the monitoring means and respective predetermined reference values.

4 Claims, 10 Drawing Figures

DRIVING APPARATUS FOR SEMICONDUCTOR LASER

BACKGROUND OF THE INVENTION

The present invention relates to an apparatus for driving a semiconductor laser. In particular, the invention concerns an apparatus for controlling output power of a semiconductor laser used as a light source for a digital optical disk device.

Recently, there has been developed a digital optical disc storage system for recording and reproducing information, in which laser light is focussed onto a metallic film deposited on a disc in the form of a minute spot for thermally recording given information on the metallic film by modulating laser light by the given information, while for reproducing the recorded information the metallic film is irradiated with laser light of such a power level at which the metallic film is protected from injuries or damages. As the laser light source for this type of apparatus, a gas laser was heretofore employed. At present, a semiconductor laser has become increasingly popular in place of the gas laser to meet the demand for miniaturization of the device, reduction in power consumption and the like. However, this semiconductor laser suffers a disadvantage in respect that the output characteristic thereof is subjected to changes or variations under the influence of ambient temperature or as time elapses.

SUMMARY OF THE INVENTION

An object of the present invention is to provide an apparatus for controlling oscillation output power of a semiconductor laser in dependence on detected variation in a characteristic of the semiconductor laser.

In view of the above object, there is provided according to an aspect of the present invention an apparatus for driving a semiconductor laser by oscillating or exciting it by a pulse signal representing information or data and superposed on a DC bias current, wherein laser light emitted by the semiconductor laser upon application of the DC bias and the pulse signal is monitored independently, to thereby control the oscillation output of the semiconductor laser in dependence on the monitored results.

DESCRIPTION OF THE PREFERRED EMBODIMENTS

Figure 1:
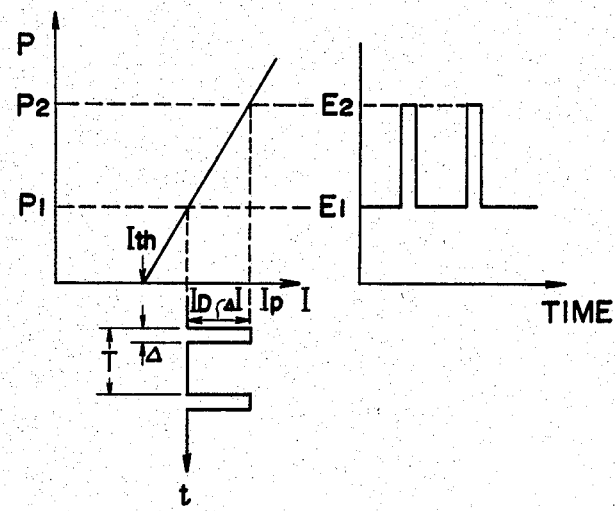
FIG. 1 is a view to illustrate a relationship between a driving current for a semiconductor laser and output power thereof.

When a semiconductor laser is used as a light source for a digital optical storage disc, the semiconductor laser is caused to oscillate at a predetermined constant power output $P_1$ by supplying thereto a constant driving current $I_D$ of predetermined magnitude in the reproducing operation, wherein the output power $P_1$ and the current $I_D$ are determined in accordance with the characteristic curve illustrated in FIG. 1, which represents a relation between the driving current I and the oscillation output power P of the semiconductor laser.

On the other hand, in the recording operation, the constant driving current $I_D$ mentioned above is superposed with a pulse current having a peak current value $I_P$ to thereby cause the semiconductor laser to oscillate so that the output power has a peak value $P_2$.

When variation in the output power of the semiconductor laser is detected by a photoelectric or photo detector, the output signal thereof has levels $E_1$ and $E_2$ in correspondence with the output power levels $P_1$ and $P_2$ of the laser, respectively. The output levels $E_1$ and $E_2$ of the photoelectric detector are then compared with respective preset reference values, whereby the driving currents $I_D$ and $I_P$ are correspondingly controlled or regulated in dependence on differences resulted from the comparisons, to thereby control the oscillation output levels $P_1$ and $P_2$ of the laser so as to have the predetermined values or levels. In connection with the control method described above, it is noted that the means for generating the control signal as well as the driving means for oscillating the semiconductor laser become different in dependence on whether possible deterioration in the characteristic of the laser is ascribable to variation in the ambient temperature or due to the variation in the characteristic of the laser which occurs as time elapses.

Figure 2:
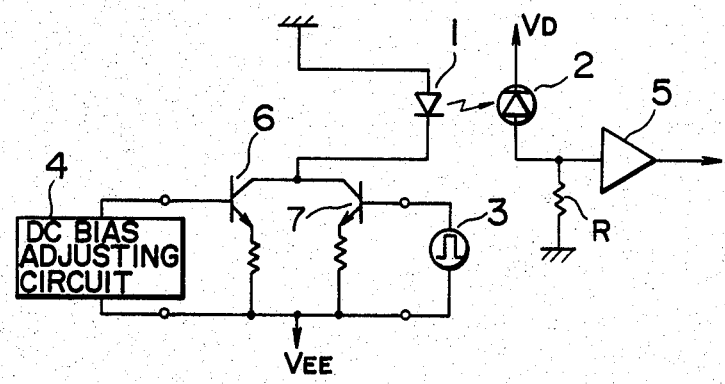
FIG. 2 is a view to illustrate a circuit for driving a semiconductor laser according to an embodiment of the present invention.

FIG. 2 shows a circuit arrangement including a semiconductor laser driving circuit for superposing a pulse-like current representative of predetermined information or data on a DC current, a photoelectric detector and an amplifier for amplifying the output of the latter. In the illustrated circuit, the photoelectric detector is constituted by a photodiode exhibiting a predetermined photoconductive characteristic. Referring to FIG. 2, a cathode electrode of the photodiode 2 is applied with a reverse bias voltage $V_D$, while the anode electrode of the photodiode 2 is connected to a resistor R serving for converting the photo current into a corresponding voltage, which is then amplified by the amplifier 5.

Two transistors 6 and 7 have collectors connected in common to the cathode of the semiconductor laser 1 whose anode electrode is connected to ground. The transistor 6 has a base input electrode to which a DC bias voltage produced by a DC bias adjusting circuit 4 is applied. By varying this bias voltage, the DC driving current $I_D$ supplied to the semiconductor laser 1 is caused to be correspondingly varied. The base of the transistor 7 is supplied with a pulse current signal representative of predetermined information or data as produced by a pulse generator 3. With the circuit configuration mentioned above, the current flowing to the semiconductor laser 1 is composed of the DC current added with the pulse current, wherein both of these currents can be controlled independently of each other. Light emitted by the semiconductor laser 1 is received by the photoelectric detector 2. In the figure, a reference letter $V_{EE}$ denotes a bias voltage supply source for the transistors 6 and 7.

Figure 3:
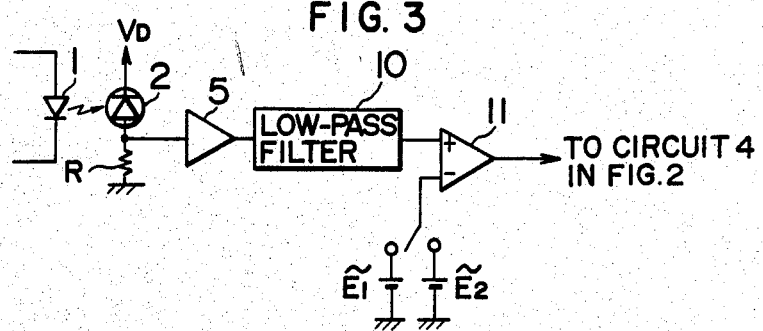
FIG. 3 is a circuit diagram for illustrating an application of the invention to an optical disc storage device.

FIG. 3 shows a semiconductor laser driving circuit according to an embodiment of the present invention, which circuit is adapted for controlling the laser power which is to be used as the light source for a digital optical storage disc. The driving circuit shown in FIG. 3 is so designed that deterioration in the laser output characteristic brought about by variation in the ambient temperature may be correctively compensated. In this figure, reference numeral 10 denotes a low-pass filter and 11 denotes a differential amplifier. Further, a reference symbol $\tilde{E}_2$ represents a preset reference voltage which is used for comparison with the voltage applied to the semiconductor laser 1 by the associated driving circuit when given information or data is to be recorded with the aid of laser light emitted by the semiconductor laser 1, while $\tilde{E}_1$ represents another preset reference voltage which is used for comparison with the voltage applied to the semiconductor laser 1 by the driving circuit when information or data is to be read out by means of the laser light emitted by the semiconductor laser 1. Describing the operation of the driving circuit, the waveform of the driving current for the recording or writing operation corresponds to the DC bias current $I_D$ superposed with the current pulse having a pulse width $\Delta$ and a pulse repetition period T, as is described hereinbefore in conjunction with FIG. 1. The repetition period T however undergoes variation in dependence of the type of modulation of the data signal. For example, in a system in which information bits corresponding to points of transition of a modified frequency modulated signal are recorded, there are three kinds of the pulse repetition periods, that is, T, 1.5 $T_o$ and 2.0 $T_o$ among which $T_o$ is the shortest period.

The output signal from the photoelectric detector 2 which has undergone amplification through the amplifier 5 is inputted to a low-pass filter 10 for deriving a mean value E which is given by the following expression:

$$E = E_1 + E_2 \times \frac{\Delta}{T} \quad (1)$$

When the current sensitivity of the semiconductor laser 1 is represented by $K_1$ and with the detection sensitivity of the photo detector 2 is represented by $K_2$, then $$E_2 - E_1 = K_2(P_2 - P_1) = K_2(K_1 I_p - K_1 I_D) \quad (2)$$
$$= K_2 K_1 (I_p - I_D) = K_2 K_1 \cdot (\Delta I)$$

In the case of the circuit configuration shown in FIG. 2, the driving current for the semiconductor laser is of such a waveform in which the DC bias current $I_D$ is superposed with the pulse-like current $\Delta I$. Accordingly, the pulse current $\Delta I$ can be controlled separately independent of the DC bias current. The deterioration or change in the characteristic of the semiconductor laser as a function of the ambient temperature among others is of such nature that the current sensitivity is not changed but the threshold current is shifted. Accordingly, in the case of this kind of change in the semiconductor laser characteristic, the control only of the DC bias current $I_D$ will be sufficient with the pulse current $\Delta I$ being held fixedly. A method of controlling the DC bias current will be described bellow:

By placing the equation (2) in the expression (1), the latter can be rewritten as follows:

$$E = E_1 \left( 1 + \frac{\Delta}{T} \right) + \frac{\Delta}{T} \cdot K_1 K_2 \cdot (\Delta I) \quad (3)$$

The reference voltage $E_2$ set for the recording operation is given by the following expression on the basis of the reference value $E_1$ set for the reproducing operation. Namely, $$\tilde{E}_2 = \tilde{E}_1 \left( 1 + \frac{\Delta}{T} \right) + \frac{\Delta}{T} \cdot K_1 K_2 \cdot (\Delta I)$$

The difference between the output voltage E of the low-pass filter and the reference voltage $E_2$ can be derived as the detection signal output from the differential amplifier 11 and expressed as follows:

$$E - \tilde{E}_2 = \left( 1 + \frac{\Delta}{T} \right) \cdot (E_1 - \tilde{E}_1)$$

In this way, only the variation in the laser output power that corresponds to the variation in the DC bias current can be detected. This detection signal is supplied to the input of the bias adjusting circuit 4 shown in FIG. 2 which serves to regulate the DC bias current, to thereby correctively control the DC bias current flowing to the semiconductor laser. Needless to say, polarity of the detection signal is so selected that the magnitude of the detection signal becomes smaller in consideration of the circuit design as well as the characteristics of the semiconductor laser as employed.

In the case of the reproducing operation, the laser output power can be controlled in the similar manner by making use of the reference voltage $\tilde{E}_1$ for the differential amplifier. Changing-over of the reference voltages $\tilde{E}_2$ and $\tilde{E}_1$ for the recording and the reproducing operations, respectively, may be accomplished by a switch circuit which has been known by itself.

The value of the pulse repetition period T appearing in the expression (1) may be selected in dependence on the type of modulation as employed. In the case of the modified frequency modulation or MFM, the value of T may be so selected as to be equal to the one of $T_o$, 1.5 $T_o$ and 2.0 $T_o$ which is expected to make appearance with the highest probability. Further, since the pulse repetition period T also varies in dependence on the pattern of data to be recorded, the value of that period may be determined on the basis of the typical one of the data patterns.

Although the driving circuit shown in FIG. 2 is of the current addition type, it goes without saying that the driving circuit may be realized in a voltage addition or other type of circuit configuration.

Next, another embodiment of the present invention which can be applied to compensation for other deteriorations of the semiconductor laser will be described by referring to FIG. 4. Such deteriorations include the aforementioned one in which only the threshold value Ith for the laser oscillation is shifted from $Ith_1$ to $Ith_2$ as illustrated by a single-dot broken line in FIG. 5 and deterioration in which the current sensitivity becomes non-linear as time elapses, as indicated by a broken line curve in FIG. 5. For controlling the output power of the semiconductor laser to compensate deteriorations in concern, the laser output power corresponding to the DC bias current and the output power corresponding to the pulse-like current are detected independent of each other.

Figure 4:
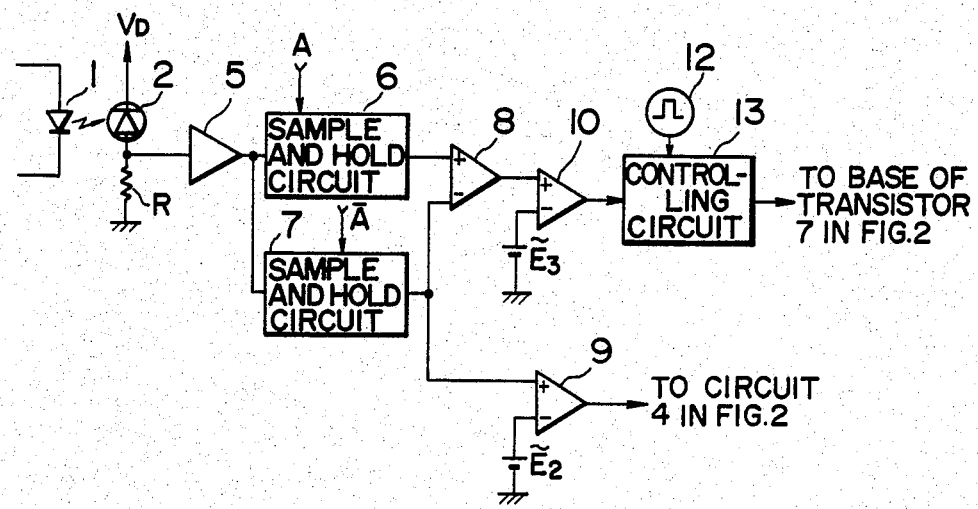
FIG. 4 is a view showing a circuit according to another embodiment of the invention.

Referring now to FIG. 4, reference numerals 6 and 7 denote sample and hold circuits, numerals 8, 9 and 10 denote differential amplifier circuits, and 13 denotes a pulse peak value control circuit. Further, a reference numeral 12 denotes a pulse generator which is identical with the pulse generator 3 shown in FIG. 2. In FIG. 4, the same reference numerals or symbols as those used in FIG. 2 denote the same or equivalent elements as or to those shown in the latter. With the circuit arrangement shown in FIG. 4, operation is effected in the manner mentioned below.

The output signal produced by the photo detector 2 is, after having been amplified by the amplifier 5, supplied to the input of the sample and hold circuits 6 and 7, respectively. The sample and hold circuit 6 is adapted to perform the sampling of the output signal from the photo detector 2 during the pulse peak period (i.e. the period corresponding to the pulse width) and hold the sampled value during the period corresponding to the DC bias level. On the other hand, the sample and hold circuit 7 is adapted to perform the sampling during the DC bias period and hold the sampled value during the pulse period (i.e. the period corresponding to the pulse width). As a signal A for controlling the sample and hold circuit 4, the output signal of the pulse generator 12 for driving the semiconductor laser may be directly utilized. However, this signal should preferably be beforehand delayed for an appropriate time in consideration of time delays involved by the photo detector and the succeeding amplifier. The signal $\overline{A}$ for controlling the sample and hold circuit 7 may be derived by inverting the signal A.

In case the driving circuit of the current addition type is used, the outputs of both the sample and hold circuits 6 and 7 are applied to both input terminals of the differential amplifier 8, whose difference output in turn is applied to one input of the differential amplifier 10 to be compared with a reference voltage $E_3$ applied to the other input of the amplifier 10. The output difference signal of the latter is supplied to the input of the control circuit 13 for controlling the crest value of the pulse signal to be superposed on the DC bias current. This control circuit 13 is also supplied with the pulse signal output from the pulse generator 12. The output signal of the control circuit 13 is supplied to the base of the transistor 7 shown in FIG. 2. The reference voltage $\overline{E}_3$ mentioned above is a voltage corresponding to the set value of difference in the laser power level ($P_2 - P_1$) of the semiconductor laser.

On the other hand, the output signal from the sample and hold circuit 7 is inputted to the differential amplifier 9 to be compared with the reference voltage $\overline{E}_1$. The output signal from the differential amplifier 9 is supplied to the means for controlling the DC bias current flowing to the semiconductor laser, i.e. the DC bias adjusting circuit 4 shown in FIG. 2. By virtue of the circuit arrangement and operation described above, it is possible to perform the control in such a manner that the laser output power may be produced at the preset level notwithstanding the variation in the laser power vis-à-vis drive current characteristic as indicated by the broken line curve in FIG. 5, by monitoring or controlling the pulse peak value and the DC bias current value separately from each other.

Figure 6A:
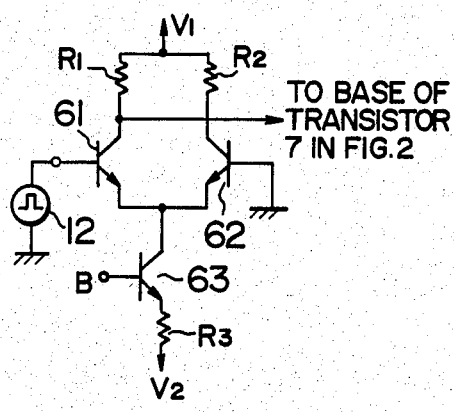
FIGS. 6a and 6b are circuit diagrams showing main portions of the circuit according to the invention.
Figure 6B:
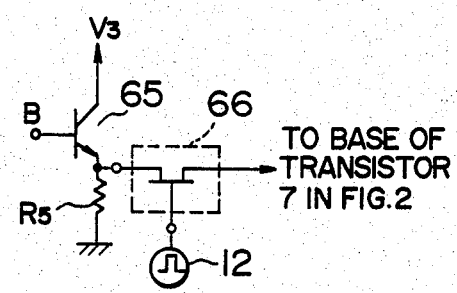

Examplary circuit configurations of the circuit 13 (shown in FIG. 4) for controlling the pulse peak value are illustrated in FIGS. 6a and 6b, respectively.

In FIG. 6a, there is shown a multiplier circuit of variable gain used for FM modulation, which comprises transistors 61 and 62 having respective collectors connected to a voltage source $V_1$ through resistors $R_1$ and $R_2$, respectively, and emitters connected in common to a collector of a transistor 63 of which emitter is connected to a voltage source $V_2$ by way of a resistor $R_3$. The output of the pulse generator 12 is coupled to the base of the transistor 61, while the output signal B of the differential amplifier circuit 10 shown in FIG. 4 is applied to the base of the transistor 63. With such circuit configuration, signal waveform corresponding to the product of the input signal to the pulse generator 12 and the output signal therefrom is obtained as the output signal available from the collector of the transistor 61, and is applied to the base of the transistor shown in FIG. 2.

Referring to FIG. 6b, there is shown a circuit in which an analog switch 66 of a C-MOS structure is used. The output signal B of the differential amplifier 10 shown in FIG. 4 is applied to the base of the transistor 65, while the output signal from the pulse generator 12 is applied to the base of the C-MOS switching transistor 66. The collector output of the transistor 65 is turned on and off by means of the analogue switch 66, whereby the pulse crest value is controlled. The output appearing at the collector of the C-MOS transistor or the analog switch 66 is then applied to the base of the transistor 7 shown in FIG. 7.

In this connection, it should be mentioned that the sample and hold circuits 6 and 7 described hereinbefore in conjunction with FIG. 4 may be replaced by gate circuits and analog switches.

Figure 8:
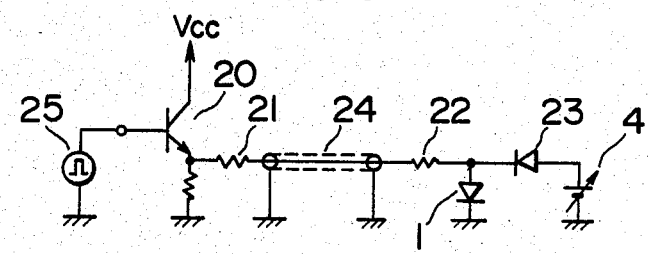
FIG. 8 is a view showing a further embodiment of the invention.

Next, description will be made of a circuit of the voltage matching type which may be used as the circuit for driving the semiconductor laser 1. FIG. 8 shows a circuit diagram illustrating an example of this type driving circuit. In this figure, the output of a pulse generator 25 which is adapted to generate a pulse signal corresponding to given information is coupled to the input of an emitter follower transistor circuit 20 for pulsedriving directly the semiconductor laser 1 through a resistor 21 of a value equal to the characteristic impedance of a coaxial cable 24. A resistor 22 serves for attaining impedance match on the basis of the value corresponding to that of a resistor 21 minus resistance of the semiconductor laser 1, whereby transmission of the driving pulse signal to the semiconductor laser can be effected without being accompanied with distortion of the signal waveform. On the other hand, one end of the semiconductor laser is coupled to the DC bias adjusting circuit 4 by way of a diode 23. In the case of this circuit, the pulse-like peak current is determined by the height of the input pulse supplied from the modulated pulse signal generator, while the DC bias current is determined solely by the voltage value of the DC bias adjusting circuit 4.

Figure 9:
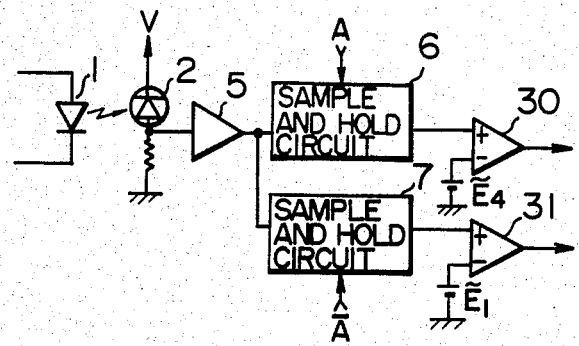
FIG. 9 is a view showing a circuit arrangement according to still another embodiment of the invention.

For controlling the laser output power of the semiconductor laser excited through the driving circuit shown in FIG. 8, a circuit shown in FIG. 9 which is realized according to another embodiment of the invention can be used. Referring to FIG. 9, reference numerals 6 and 7 denote, respectively, sample and hold circuits which function in the same manner as those shown in FIG. 4, and reference numerals 30 and 31 denote differential amplifier circuits. In FIG. 9, same or equivalent parts as or to those shown in FIG. 2 are denoted by like reference symbols. In operation, the output signal of the sample and hold circuit 6 is compared with a reference value $\bar{E}_4$ for the pulse-like peak power through the differential amplifier 30, wherein the resulting error signal is inputted to the modulated pulse generator 25 for controlling the peak pulse current value. On the other hand, the output signal of the sample and hold circuit 7 is compared with the reference value $\bar{E}_1$ for the DC bias current through the differential amplifier 31, wherein the resulting error signal, if any, is utilized for driving the DC bias adjusting circuit 4 to control the DC bias current supplied to the semiconductor laser.

The DC bias adjusting circuit 4 for regulating the DC bias current for the semiconductor laser by utilizing the output error signal of the differential amplifier 31 can be realized by making use of a conventional adder circuit. In that case, the error signal may be applied to one input of the adder circuit, while the voltage for arbitrarily setting the DC bias is applied to the other input of the adder circuit.

Figure 5:
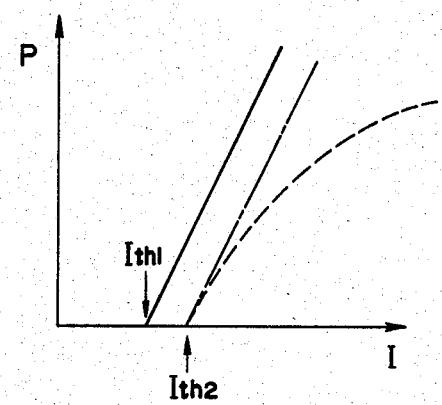
FIG. 5 is a view to illustrate deteriorations or changes in a characteristic of a semiconductor laser.
Figure 7:
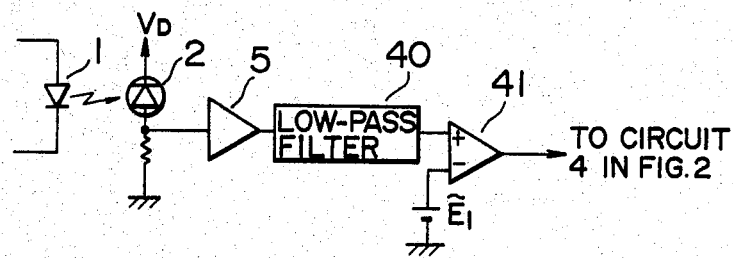
FIG. 7 is a view illustrating another embodiment of the present invention.

In the case the semiconductor laser suffers deterioration of such mode as represented by the single dot broken line in FIG. 5, only the DC current component may be detected in place of the pulse crest value by a circuit shown in FIG. 7 for performing the control in the substantially same manner as described hereinbefore in conjunction with FIG. 2. In FIG. 7, a reference numeral 40 denotes a low-pass filter and 41 denotes a differential amplifier. Other reference symbols represent same parts as those described above.

As will be appreciated from the foregoing, it is possible according to the teaching of the present invention to perform such control that the laser output power of a semiconductor laser remains constantly at a preset value or level notwithstanding deteriorations or variations in the power vis-à-vis current characteristic as brought by variation in the ambient temperature or as a function of time lapse, by correspondingly controlling the DC current component as well as the pulse current component for driving the semiconductor laser.

We claim:

1. An apparatus for driving a semiconductor laser, comprising: a DC bias current source for generating a DC current applied to said semiconductor laser; a pulse generating source for producing pulses superposed onto said DC current; a photo detector for receiving laser light emitted by said semiconductor laser; first means for monitoring the output signal of said photo detector upon application of said DC bias current; and second means for monitoring the output signal of said photo detector upon application of said pulse, wherein the DC output current of said DC bias current source is controlled by utilizing the output signal of said first means, while the pulse current output of said pulse generating source is controlled by using the output signal of said second means, wherein said first means includes a first sample and hold circuit for sampling and holding the output signal of said photo detector during a period in which said DC bias current is applied, and first comparison means for comparing the output signal of said first sample and hold circuit with a first predetermined reference value, and wherein said second means includes a second sample and hold circuit for sampling and holding the output signal of said photo detector during a period in which said pulse current is applied, a differential circuit for deriving difference between the output signals of said second sample and hold circuit and said first sample and hold circuit, and second comparison means for comparing the output signal of said differential circuit with a second predetermined reference value.

2. An apparatus for driving a semiconductor laser, comprising: a DC bias current source for generating a DC current applied to said semiconductor laser; a pulse generating source for producing pulses superposed onto said DC current; a photo detector for receiving laser light emitted by said semiconductor laser; first m;eans for monitoring the output signal of said photo detector upon application of said DC bias current; and second means for monitoring the output signal of said photo detector upon application of said pulse, wherein the DC output current of said DC current source is controlled by utilizing the output signal of said first means, while the pulse current output of said pulse generating source is controlled by using the output signal of said second means, wherein said first means includes a first sample and hold circuit for sampling and holding the output of said photo detector during a period on which said DC bias is applied and first comparison means for comparing the output of said first sample and hold circuit with a first predetermined reference value, and wherein said second means includes a second sample and hold circuit for sampling and holding the output of said photo detector during a period in which said pulse is applied, and second comparison means for comparing the output of said second sample and hold circuit with a second predetermined value.

3. An apparatus for driving a semiconductor laser, comprising a DC current generating source and a pulse generating source for driving said semiconductor laser; a photo detector for receiving laser light emitted by said semiconductor laser; first and second sample and hold circuits for sampling and holding the output of said photo detector, said first sample and hold circuit serving to sample and hold the output of said photo detector during a period in which said pulse is applied to said semiconductor laser, while said second sample and hold circuit samples and holds the output of said photo detector during a period in which said DC current is applied to said semiconductor laser; differential means for deriving a difference between the outputs of said first and second sample and hold circuits; first comparison means for comparing the output of said differential means with a first predetermined reference value; control means for controlling the pulse output from said pulse generating source in dependence on the output of said first comparison means; and second comparison means for comparing the output of said second sample and hold circuit with a second predetermined reference value, wherein the output of said DC current generating source is controlled in dependence on the output of said second comparison means.

4. An apparatus for driving a semiconductor laser according to claim 3, wherein said first sample and hold circuit is controlled by a delayed signal obtained by delaying the output pulse from said pulse current generating source by a predetermined amount of time, and wherein said second sample and hold circuit is controlled by an inversed signal obtained by inverting the polarity of said delayed signal.

* * * * *